United States Patent
Baello et al.

(10) Patent No.: US 10,593,640 B2
(45) Date of Patent: Mar. 17, 2020

(54) FLIP CHIP INTEGRATED CIRCUIT PACKAGES WITH SPACERS

(71) Applicant: Texas Instruments Incorporated, Dallas, TX (US)

(72) Inventors: James Raymond Maliclic Baello, Pampanga (PH); Rafael Jose Lizares Guevara, Makati Metro Manila (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/956,534

(22) Filed: Apr. 18, 2018

(65) Prior Publication Data

US 2019/0326245 A1 Oct. 24, 2019

(51) Int. Cl.
*H01L 23/48* (2006.01)
*H01L 23/00* (2006.01)

(52) U.S. Cl.
CPC .............. *H01L 24/17* (2013.01); *H01L 24/09* (2013.01); *H01L 24/11* (2013.01); *H01L 24/81* (2013.01); *H01L 2224/0401* (2013.01); *H01L 2924/014* (2013.01); *H01L 2924/01029* (2013.01)

(58) Field of Classification Search
CPC ......... H01L 24/17; H01L 24/81; H01L 24/09; H01L 24/11
See application file for complete search history.

(56) References Cited

U.S. PATENT DOCUMENTS

| 5,400,950 | A | 3/1995 | Myers et al. |
|---|---|---|---|
| 6,348,401 | B1 | 2/2002 | Chen et al. |
| 2009/0302427 | A1* | 12/2009 | Su ................. H01L 21/563 257/620 |
| 2010/0190294 | A1* | 7/2010 | Simmons-Matthews ................. H01L 24/14 438/108 |
| 2016/0148888 | A1* | 5/2016 | Ryu ................. H01L 24/14 257/621 |
| 2016/0818122 | | 6/2016 | Wu et al. |
| 2018/0012829 | A1* | 1/2018 | Mangrum ......... H01L 23/49565 |

OTHER PUBLICATIONS

Rafael Jose Lizares Guevars, Bump Planarity Control, Dec. 28, 2017, U.S. Appl. No. 15/856,236.

* cited by examiner

*Primary Examiner* — Didarul A Mazumder
*Assistant Examiner* — Wasiul Haider
(74) *Attorney, Agent, or Firm* — Dawn Jos; Charles A. Brill; Frank D. Cimino

(57) ABSTRACT

In a described example, an apparatus includes a semiconductor substrate and at least two pillar bumps formed on an active surface of the semiconductor substrate, the at least two pillar bumps extending away from the active surface and having ends spaced from the semiconductor substrate with solder material at the ends of the at least two pillar bumps. At least one spacer is formed on the active surface of the semiconductor substrate, the at least one spacer extending a predetermined distance from the active surface of the semiconductor substrate. A package substrate has a die mount area on a first surface including portions receiving the ends of the at least two pillar bumps and receiving an end of the at least one spacer. Mold compound covers the semiconductor substrate, the at least two pillars, the at least one spacer, and at least a portion of the semiconductor substrate.

21 Claims, 10 Drawing Sheets

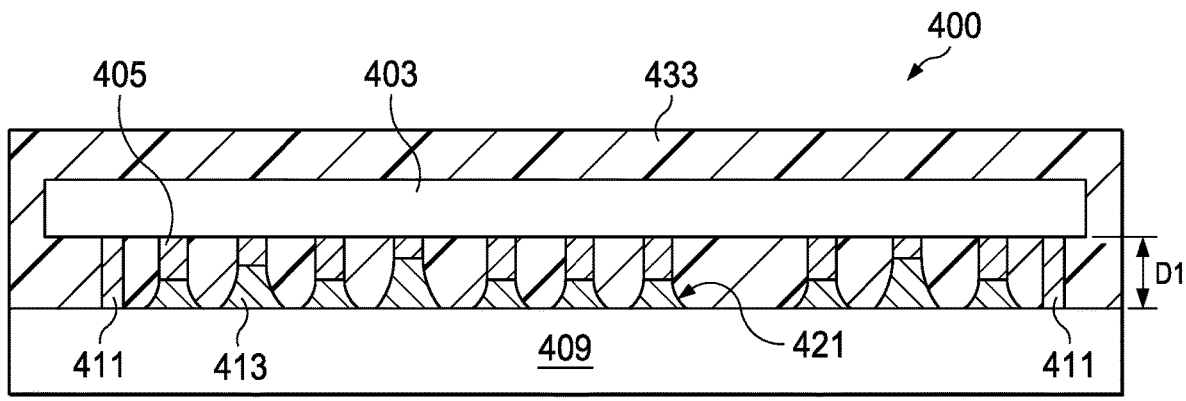
FIG. 4
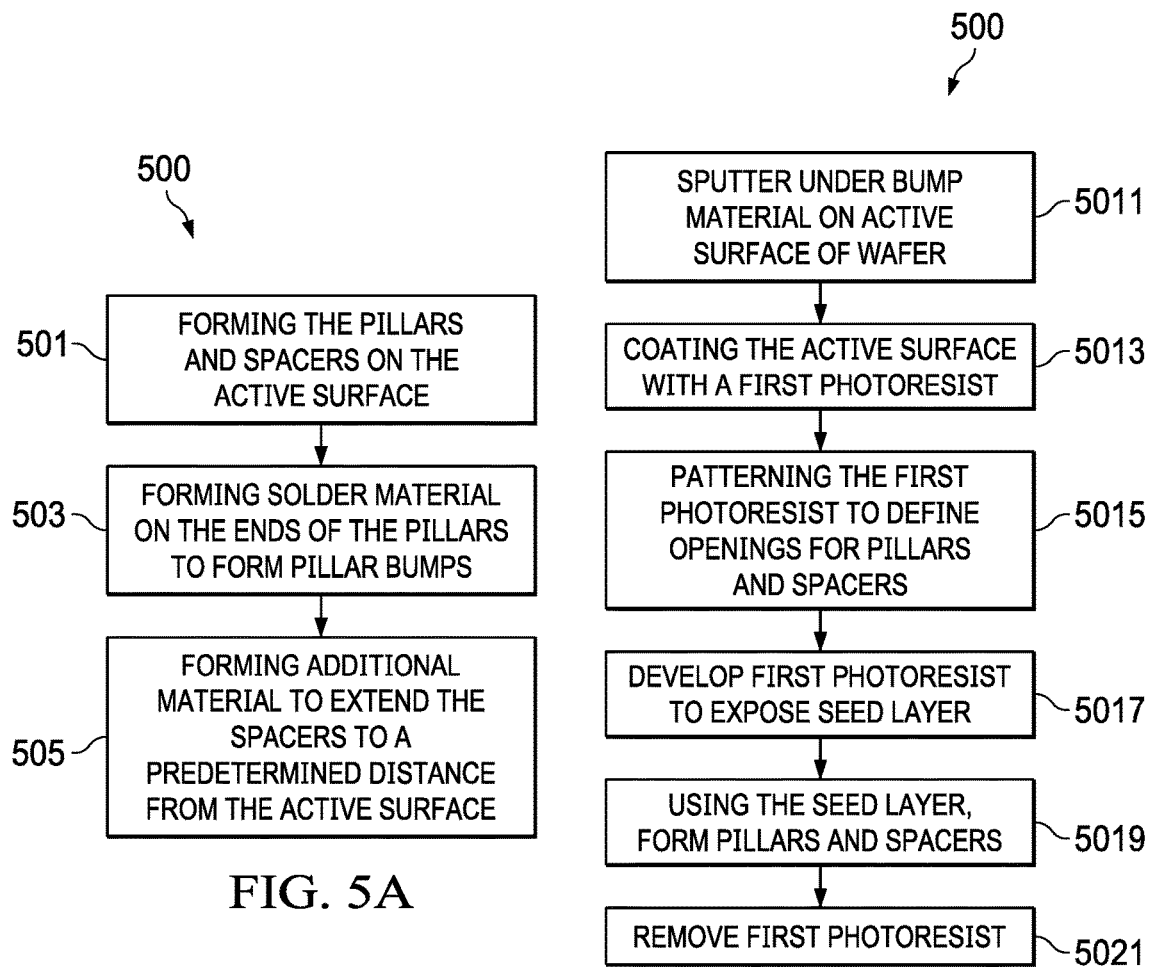
FIG. 5A
FIG. 5B

FLIP CHIP INTEGRATED CIRCUIT PACKAGES WITH SPACERS

TECHNICAL FIELD

This disclosure relates generally to packaged integrated circuits with pillar bumps for flip chip connection to a substrate, and more particularly to a device and method for flip chip packaged integrated circuits.

BACKGROUND

In assembling integrated circuits, devices are formed on a semiconductor wafer using semiconductor processing. Once processed to a complete stage, the individual integrated circuit devices may be separated from one another or "singulated." The individual devices may be referred to as "dies" or as "integrated circuit dies." During completion of the semiconductor processes that form circuitry on the dies, terminals are formed for providing signal and power electrical connections to the circuitry within the dies. For example the dies may have aluminum bond pads or copper bond pads on an active surface, or "face," of the device that are the terminals. Recent package types that provide packaged integrated circuits for surface mounting to a system board or module include "flip chip" on lead frame assemblies disposed within molded packages. In a flip chip integrated circuit package, the integrated circuit has posts or pillars formed on the bond pads on the active surface and extending away from the active surface of the die. The pillars may be of copper. Solder is formed on the ends of the pillars to form pillar bumps. The pillars are conductive and the pillar bumps form electrical connections to the bond pads.

The individual integrated circuits are then removed from the semiconductor wafer by singulation to form integrated circuit dies. In assembly, the integrated circuit dies are positioned so that the active surface of the integrated circuit device faces a surface of a package substrate, for example a lead frame, in a die mounting area. Conductors in the package substrate may have conductive lands that correspond to the pillar bumps for making electrical and physical connections to the die. The solder of the pillar bumps is bonded to the package substrate using a thermal reflow process. In the thermal reflow process, heat sufficient to melt the solder is applied. The solder reflows onto the substrate, for example a lead frame, and then forms solder joints that physically bond and electrically connect the integrated circuit die to the package substrate. Non-uniform sized posts or pillars and/or non-uniform solder thickness of solder material at the ends of the pillar bumps can create non-uniform bond line thicknesses in the solder joints formed during assembly of a packaged integrated circuit.

SUMMARY

In a described example, an apparatus includes a semiconductor substrate having an active surface with bond pads; at least two pillar bumps formed on at least two of the bond pads, the at least two pillar bumps extending away from the active surface and having ends spaced from the semiconductor substrate with solder material at the ends of the at least two pillar bumps. At least one spacer is formed on the active surface of the semiconductor substrate and extending away from the semiconductor substrate, the at least one spacer extending a predetermined distance from the active surface of the semiconductor substrate. A package substrate has a die mount area on a first surface for mounting the semiconductor substrate, the die mount area including portions receiving the ends of the at least two pillar bumps and receiving an end of the at least one spacer. Mold compound covers the semiconductor substrate, the at least two pillars, the at least one spacer, and at least a portion of the semiconductor substrate.

BRIEF DESCRIPTION OF THE DRAWINGS

FIG. 4 is a cross sectional view of an arrangement including an integrated circuit die with pillar bumps and spacers after mounting to a package substrate.

FIGS. 5A-5D are flow diagrams of a method for forming pillar bumps and spacers on a semiconductor substrate.

DETAILED DESCRIPTION

Corresponding numerals and symbols in the different figures generally refer to corresponding parts, unless otherwise indicated. The figures are not necessarily drawn to scale. As is further described herein below, certain structures and surfaces are described as "parallel" to one another. For purposes of this disclosure, two elements are "parallel" when the elements are intended to lie in planes that, when extended, will not meet. However, the term "parallel" as used herein also includes surfaces that may slightly deviate in direction due to manufacturing tolerances. If the two surfaces generally lie in planes that are spaced apart and which would not intersect when extended infinitely if the surfaces were made without these deviations, these surfaces are also parallel.

As is further described herein below, certain structures and surfaces are described as "perpendicular" to one another. For purposes of this disclosure, two elements are "perpendicular" when the elements are intended to form a 90-degree angle at an intersection. However, the term "perpendicular" as used herein also includes surfaces that may slightly deviate from 90 degrees due to manufacturing tolerances. As is further described hereinbelow, an integrated circuit die including pillar bumps can be mounted to a surface of a "package substrate." As used herein, a package substrate is a substrate used for mounting integrated circuit dies in packaging of integrated circuits and can be, for example: a lead frame; a molded interconnect substrate; a premolded lead frame; a preplated lead frame, a copper substrate; a printed circuit board (PCB); a film having conductors formed thereon; a tape having conductors formed thereon; a multiple layer substrate with conductors on a surface and at different layers; or a laminate material with conductors thereon.

Figure 1:
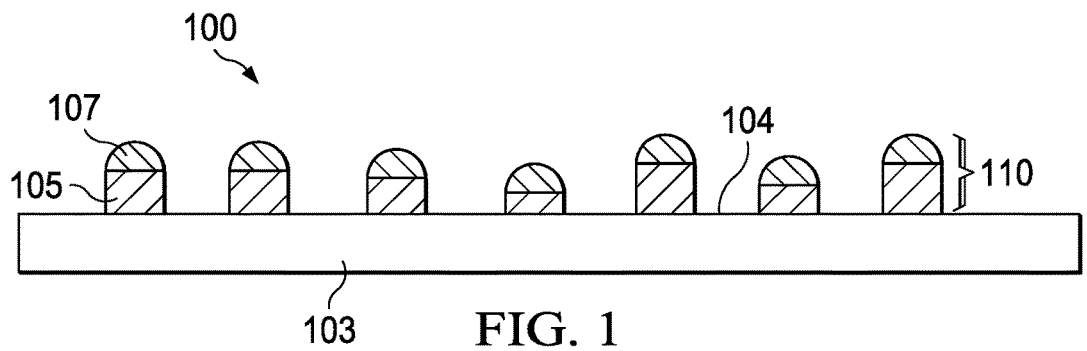
FIG. 1 is a cross sectional view of a semiconductor substrate with pillar bumps.

FIG. 1 is a cross sectional view of portion (or an individual integrated circuit die) 100 of a semiconductor substrate, such as a semiconductor wafer, that has pillars or posts formed on a surface. There may be one, two, at least two pillars, or many pillars, depending on the functionality and the number of signals received by or transmitted from an integrated circuit on the semiconductor substrate. In FIG. 1, the semiconductor substrate 103 is oriented in with an active surface facing upwards, or "face up" as oriented and shown in FIG. 1. The semiconductor substrate 103 may have active or passive devices formed within the semiconductor substrate, or formed on or over the active surface 104 of the semiconductor substrate 103. In an example, active devices such as transistors or diodes, and/or passive devices such as inductors, capacitors, or resistors, are formed in a semiconductor manufacturing process. P-type and N-type regions can be formed in the semiconductor substrates using photolithography and ion implantation techniques to define p-n junctions for transistors or diodes. Dielectric material such as oxides, nitrides, oxynitrides and other dielectrics can be thermally grown or deposited over the active surface of the semiconductor substrate or wafer. The dielectrics can form isolation material, form gate oxides for transistors, or can form capacitor dielectrics. The dielectrics can also electrically isolate layers of conductor materials formed over the active surface of the semiconductor substrate. Interconnecting conductors can be formed using the layers of conductive materials including metal or alloys and using photolithography to define conductor patterns. Copper conductors can be formed using chemical mechanical polishing (CMP) processes and damascene processes or copper plating. Vertical connections can be made using conductive vias or conductive plugs between layers of conductors. Aluminum conductors can be formed using sputter layers and electroless deposition or electroplating. The semiconductor fabrication process forms a plurality of identical integrated circuit dies on the active surface of a semiconductor substrate separated from one another by scribe lines. The completed integrated circuit dies can be separated from one another using a singulation method to saw or scribe through the scribe lines and so form individual integrated circuit dies.

In FIG. 1, a semiconductor substrate 103 or a portion thereof is shown with posts or pillars 105 formed on the active surface 104. The pillars 105 have solder bumps 107 formed at the end away from the active surface 104 of the semiconductor substrate 103. The completed pillars with solder bumps are often referred to as "pillar bumps." Since the material of the pillars is often copper which is frequently used in semiconductor fabrication, the complete structure 110 is sometimes referred to as a "copper pillar bump." Copper is economical to use, has low resistance and can form low resistance electrical connections. However, other conductive materials can be used to form the pillars 105. As shown in FIG. 1, deviations in pillar sizes or shapes, and deviations in process conditions and materials can result in inconsistent pillar heights (where the height is the distance extending away from the active surface 104 of the semiconductor substrate 103) for the pillars 105. The pillars may have varying diameters or shapes in different positions on the active surface, which can result in different heights when the pillars are formed. The solder material may also deposit at different sizes and heights, and during a subsequent thermal reflow, may form different thickness solder joints between the pillars and a substrate. As is further described hereinbelow, this height deviation can cause misalignment or device failures when the pillar bumps are used in a solder reflow process to mount an integrated circuit die to a package substrate. Failures can include non-wetting of plating material on the package substrate during thermal solder reflow, and alignment of the pillar bumps to the substrate can be affected, causing misalignment. During testing, solder joints may fail or be found to be high resistance joints. The package substrate can be a lead frame. The lead frame may have pre-plated lands for soldering that include thin solderable plating layers such as nickel, gold, silver, and palladium. Silver spot plating is useful on lead frames. Gold or nickel gold coatings on copper lead frames are used. The pillar bumps need to align to the spots or lands plated onto the lead frames. In an alternative, overall pre-plating coatings that cover all surfaces or only a portion of the lead frame can be used.

Figure 2:
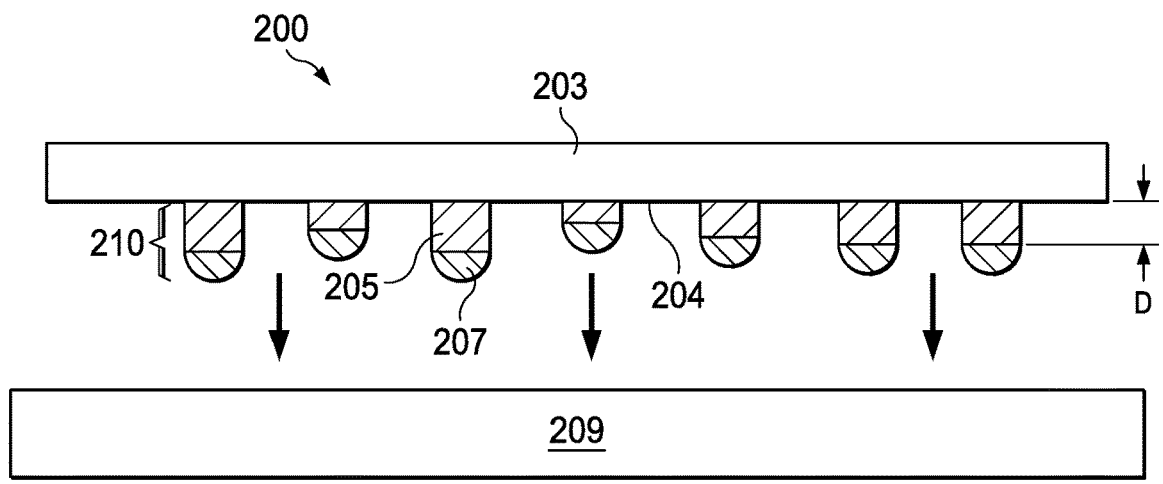
FIG. 2 is a cross sectional view of an integrated circuit die with pillar bumps being mounted on a package substrate.

FIG. 2 illustrates in a cross sectional view 200 the mounting of an integrated circuit having pillar bumps to a package substrate. In FIG. 2, similar reference numerals are used for elements similar to those in FIG. 1, for clarity. For example, pillars 205 correspond to pillars 105 in FIG. 1. In FIG. 2, an integrated circuit die 203 is shown oriented face down, or "flipped," for assembly as a flip chip device. (In FIG. 1, in contrast, the semiconductor substrate 103 is shown face up.)

In the operation illustrated in FIG. 2, an integrated circuit die 203 (which is a single integrated circuit device taken from a completed semiconductor substrate or wafer) is shown being aligned for flip chip mounting to a package substrate 209. In one arrangement, the package substrate 209 can be a lead frame having conductive lands (not shown) corresponding to the positions of the pillar bumps 210. The pillar bumps 210 include a pillar 205 and solder bump 207. The lead frame can be of copper or another conductive material. For example, an alloy such as alloy 42 (a nickel iron alloy that is 42% nickel and which has good conductivity and low thermal expansion and that is used for lead frames for semiconductor packages) can be used as a lead frame. In further alternatives, other metals and conductive metals and alloys can be used to form the lead frame. In alternative arrangements, the package substrate 209 can be a printed circuit board (PCB), a molded interconnect substrate, a premolded lead frame, or another substrate for electrical components that are to be surface mounted. In these alternatives the package substrate can have conductive lands arranged in correspondence to the positions of the pillar bumps 210. The conductive lands can be plated with material to aid in solderability, for example, the lands may have nickel, gold, or palladium coatings and combinations of these, including: electroless nickel immersion gold (ENIG), electroless nickel, electroless palladium, immersion gold (ENEPIG) and other coatings used for solderability when surface mounting components with solder joints. These coatings are very thin, such as a few microns, and so are not shown in the figures. In an alternative approach, a bare copper portion of the lead frame is used for the lands. In yet another alternative approach, the lead frame has a pre-plating formed over the entire die mount surface for use in flip chip mounting. This preplating can be a material to aid in soldering the pillar bumps to the lead frame, for example nickel and palladium, ENIG, ENEPIG, or other combinations of nickel, palladium and gold can be used as a preplating. In another alternative, a bare copper lead frame can be coated with an organic coating such as OSP ("organic solderability preservative") to maintain solderability by preventing oxidation of the copper surfaces.

As shown in FIG. 2, when the pillars 205 have varying heights "D" (the heights being the distance the pillars extend away from the active surface 204 of the integrated circuit die 203), a solder bond line that forms in a subsequent solder thermal reflow process will have varying thickness or dimensions. In some cases the integrated circuit die 203 can even tilt away from a level position during the thermal solder reflow process. If the height variance between the pillars 205 is great enough, the variance in the heights of pillar bumps 210 can cause opens or weak solder joints to form after the solder reflow. If a high resistance solder joint forms due to the height variance, field failures such as solder joint cracking may occur when the solder joint is exposed to current flow in package testing or later when current flows while through the solder joint when the integrated circuit die is used in operation. Misalignment can occur between the pillar bumps 210 and the lands on the package substrate 209 or during solder reflow if die tilt causes motion of the die while the solder is in a molten state during thermal reflow.

Figure 3:
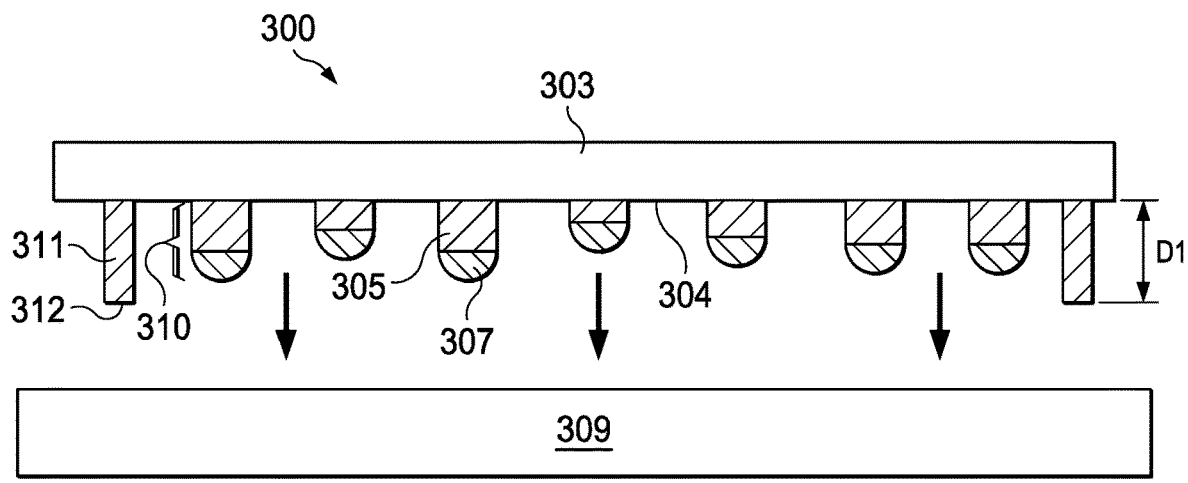
FIG. 3 is a cross sectional view of an arrangement including an integrated circuit die having spacers being mounted on a surface of a package substrate.

FIG. 3 illustrates an arrangement in a cross sectional view 300 including an integrated circuit die 303 with pillars 305 with solder bumps 307 forming pillar bumps 310. In FIG. 3, reference numerals for elements similar to elements shown in FIG. 2 are similar, for clarity. For example, integrated circuit die 203 of FIG. 2 corresponds to integrated circuit die 303. Spacers 311 also extend from the active surface of the integrated circuit die 303 to a height D1 measured from the surface 304 of the integrated circuit die 303. The spacers 311 do not have solder on the spacer ends 312 because in the arrangements, the spacers are not used to couple electrical signals from the integrated circuit die 303 to the substrate 309, instead these spacers 311 are used to control the spacing between the active surface of the integrated circuit die 303 and the surface of the package substrate 309 after the integrated circuit die 303 is mounted. A portion of package substrate 309 is a die mount area (not shown), where the integrated circuit die 303 will be mounted to the package substrate 309. In an example, the spacers 311 can be formed of the same material as the pillars 305. The spacers 311 will be of equal size to one another, but are not necessarily the same shape, size or diameter as the pillars 305. In one example, the spacers 311 and the pillars 305 are formed in a plating process at a same time. However, in an alternative arrangement the spacers 311 can be formed in a process that is independent of the process that forms pillars 305. In an example the pillars 305 and the spacers 311 can be formed of copper. In an alternative, the pillars and the spacers 311 can be formed of another conductive material. In still another alternative example, the spacers 311 and the pillars 305 can be formed of different materials. In an alternative, the spacers are formed of another non-reflowable metal. Copper is a convenient material for the spacers since the pillars are also often conveniently formed of copper. Nickel and palladium or platings of nickel and palladium can be used. These materials are also often used as platings and are therefore available for the process. The spacers 311 need not be conductive, although the spacers can be formed of material which is conductive. The spacers 311 should not deform during subsequent processes including thermal reflow.

FIG. 4 illustrates an arrangement in a cross sectional view 400 including an integrated circuit die 403 with pillars 405 and solder 413 on pillars 405 forming pillar bumps. The arrangement is covered with a mold compound 433 that covers the integrated circuit die, the pillars 405 and solder joints 421 and a portion of a package substrate 409. In FIG. 4, reference numerals for elements similar to elements shown in FIG. 2 are similar, for clarity. For example, integrated circuit die 403 corresponds to 203 in FIG. 2. In FIG. 4 the results of mounting an integrated circuit die 403 with spacers 411 and pillars 405 with solder joints 421 to a package substrate 409 using a solder reflow process are shown. The integrated circuit die is flip chip mounted with an active surface facing the package substrate. Solder 413 is shown after a thermal reflow process causes the solder to melt and bond to the surface of package substrate 409 (the upper surface of package substrate 409 as oriented in FIG. 4) to form solder joints 421. The ends of spacers 411 contact the surface of package substrate 409 and provide a spacing of a predetermined distance D1 that is the height of the spacers 411. Because the spacers 411 have a common and fixed height D1 due to the use of non-reflowable material and by using the same feature size among the spacers, the distance D1 is a controlled spacing between the active surface of the integrated circuit die 403 and the surface of package substrate 409. This controlled predetermined spacing also determines the solder bond line thickness that results after solder reflow of solder bumps 413 and enables a predetermined solder bond line thickness as a process parameter. Problems associated with a non-uniform solder bond line thickness of flip chip mounted integrated circuits using pillar bumps as shown in FIG. 2 are eliminated or reduced by use of the spacers of the arrangements. After the assembly, a mold compound such as epoxy resin is applied to cover the semiconductor die, the spacers 411, the pillar bumps 410, and a portion of the package substrate 409 to complete a packaged integrated circuit.

Figure 5C:
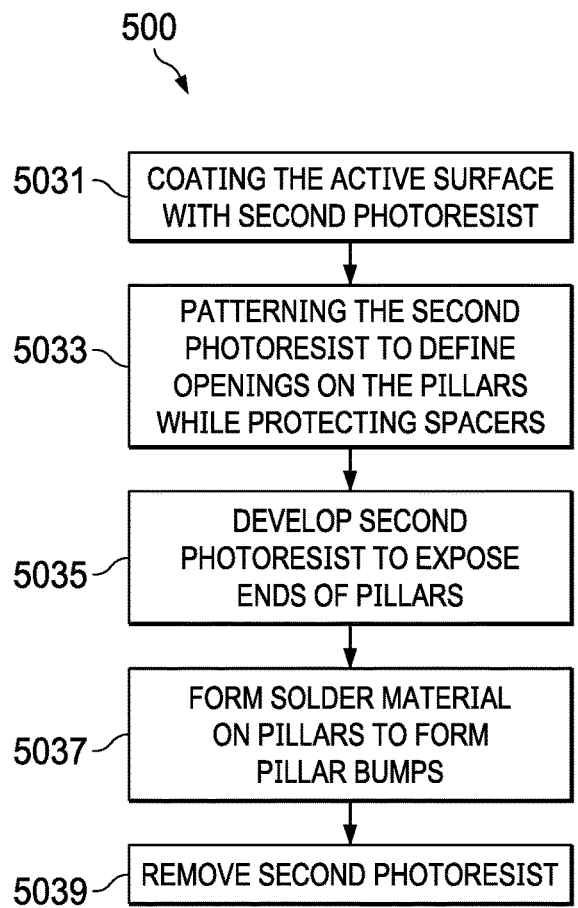
Figure 5D:
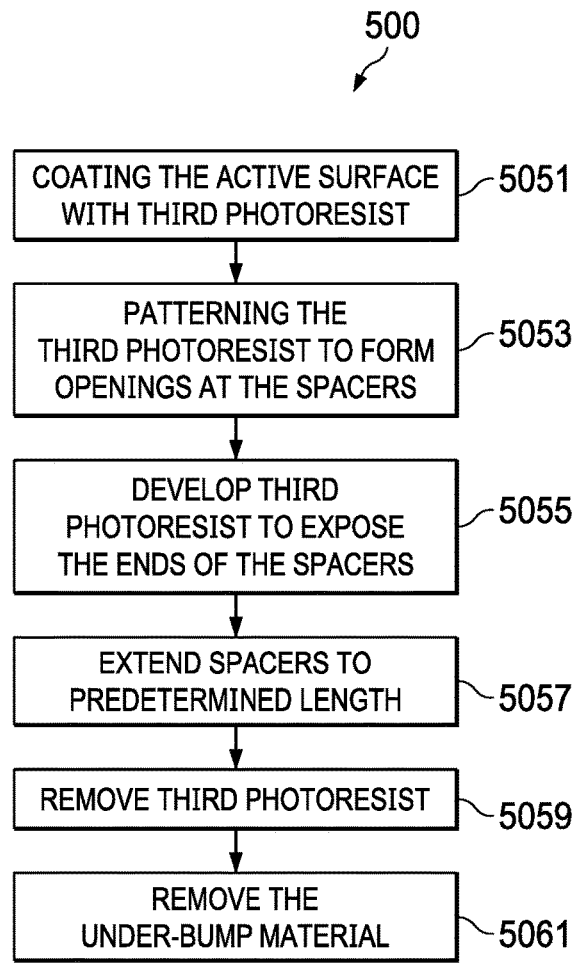
Figure 6A:
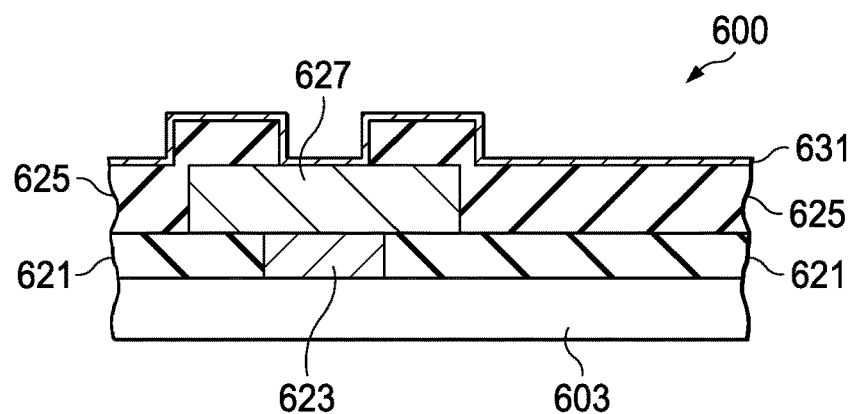
FIGS. 6A-N are cross sectional views illustrating the results of methods such as shown in FIGS. 5A-5D for forming arrangements.
Figure 6B:
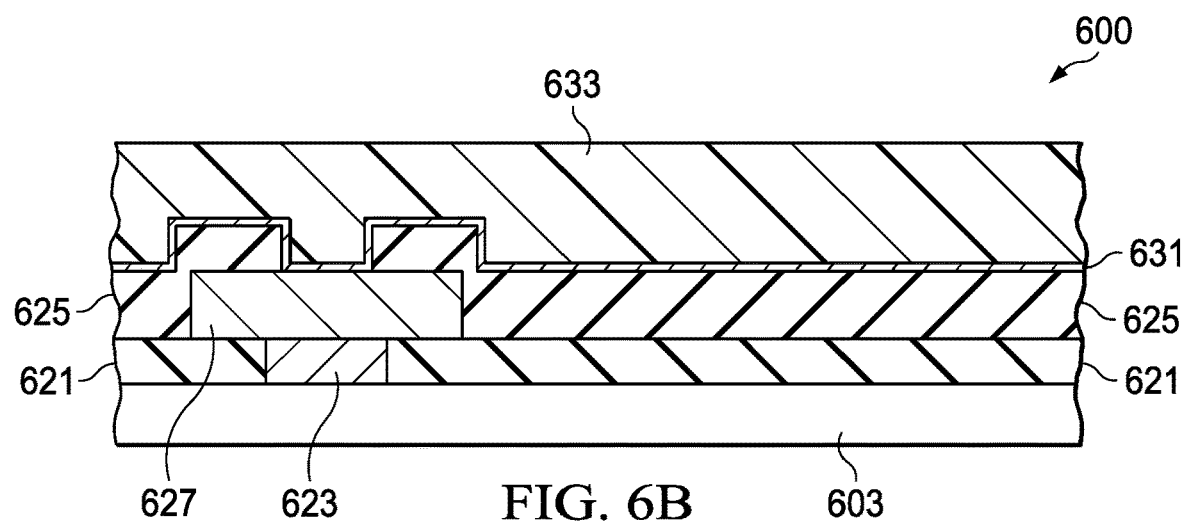
Figure 6C:
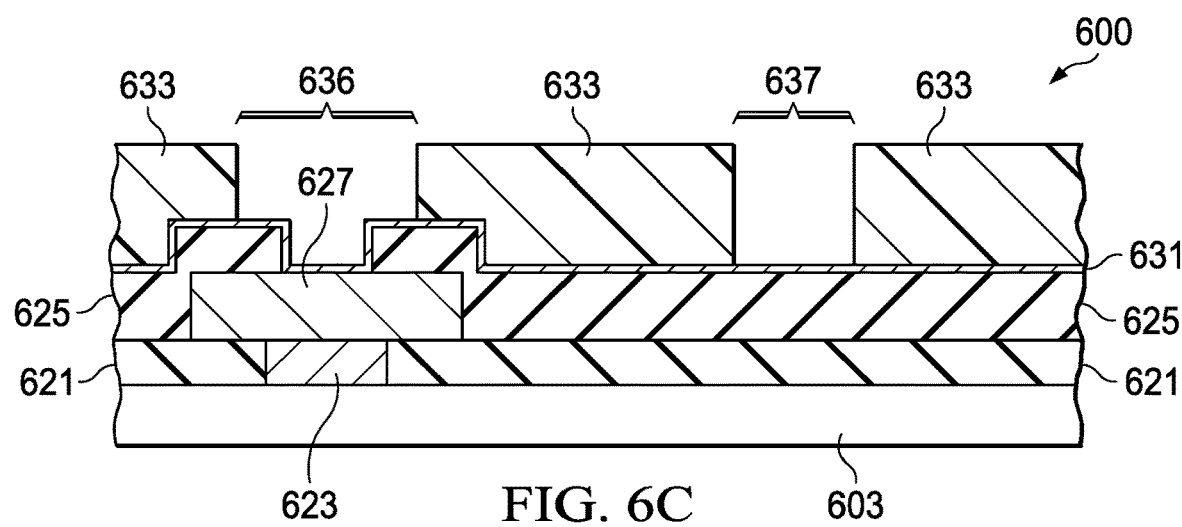
Figure 6D:
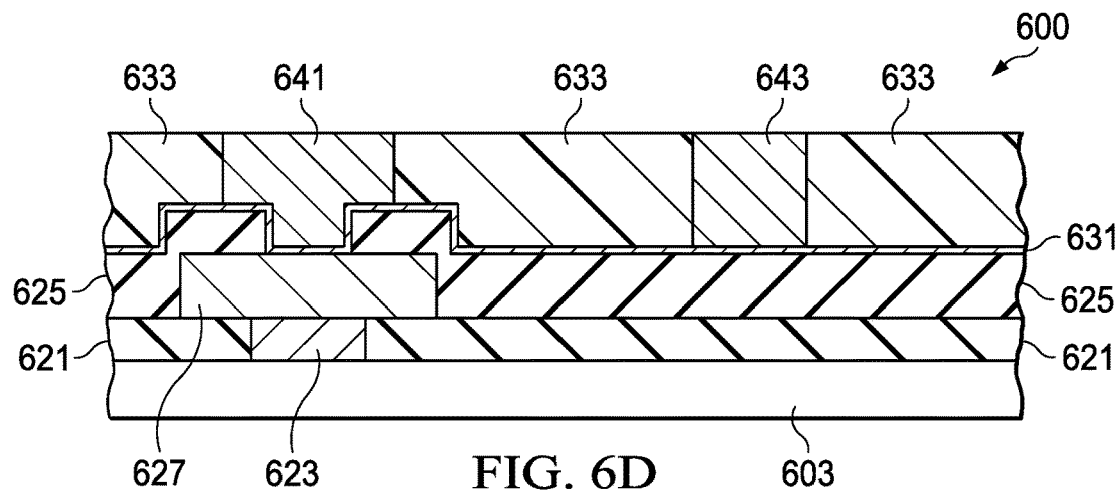
Figure 6E:
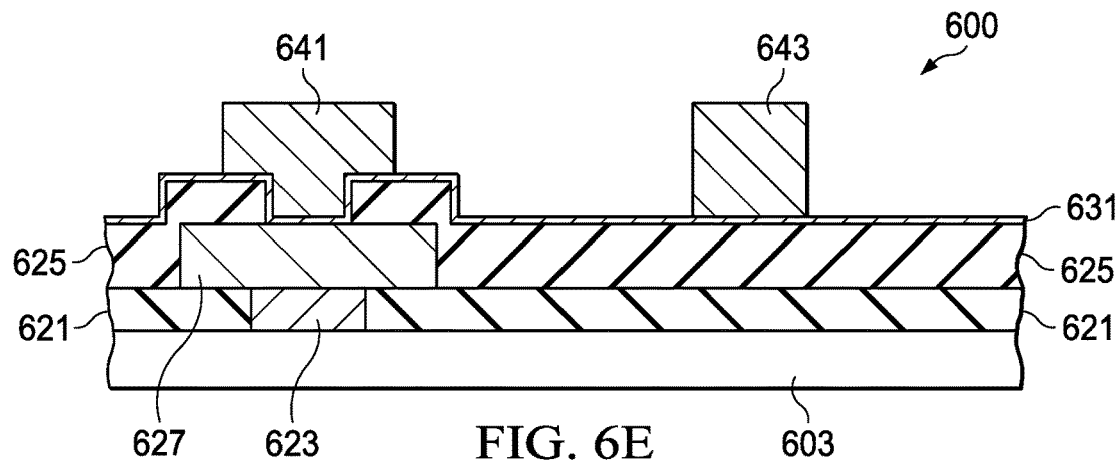
Figure 6F:
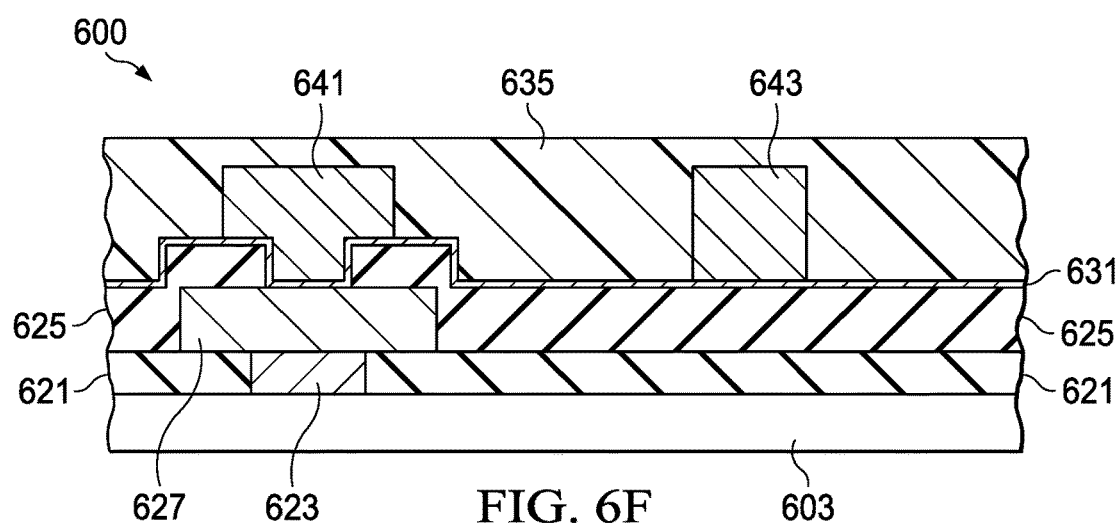
Figure 6G:
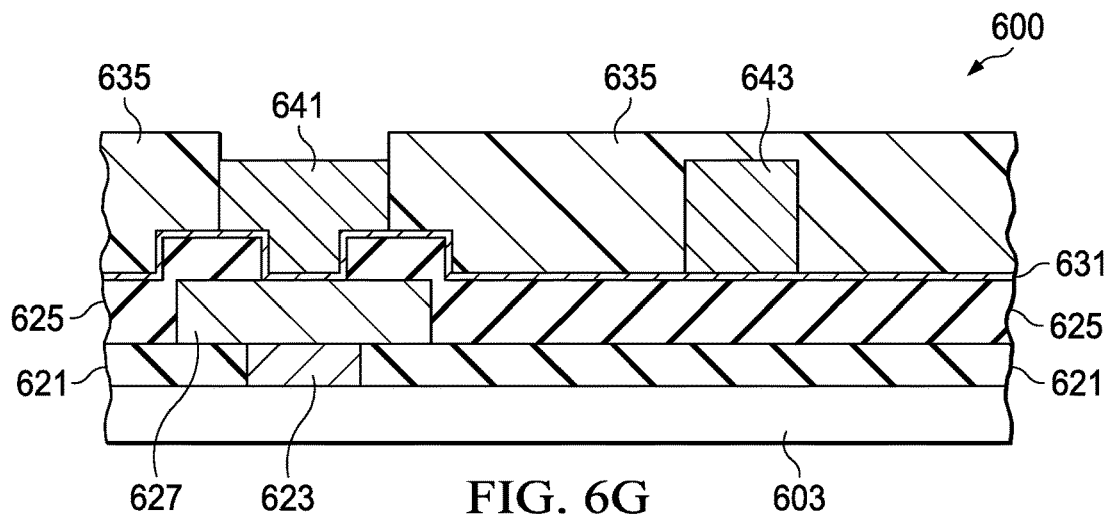
Figure 6H:
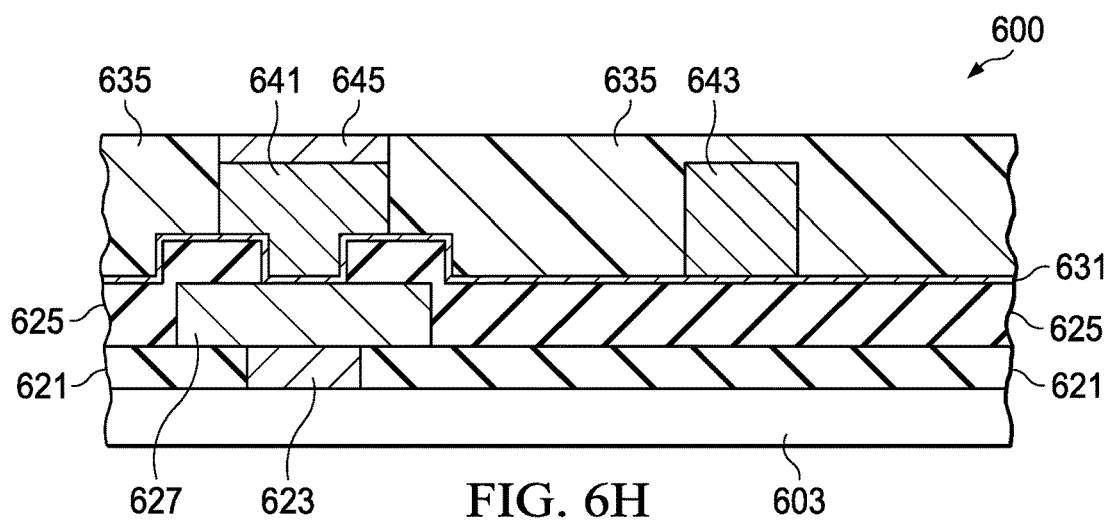
Figure 6I:
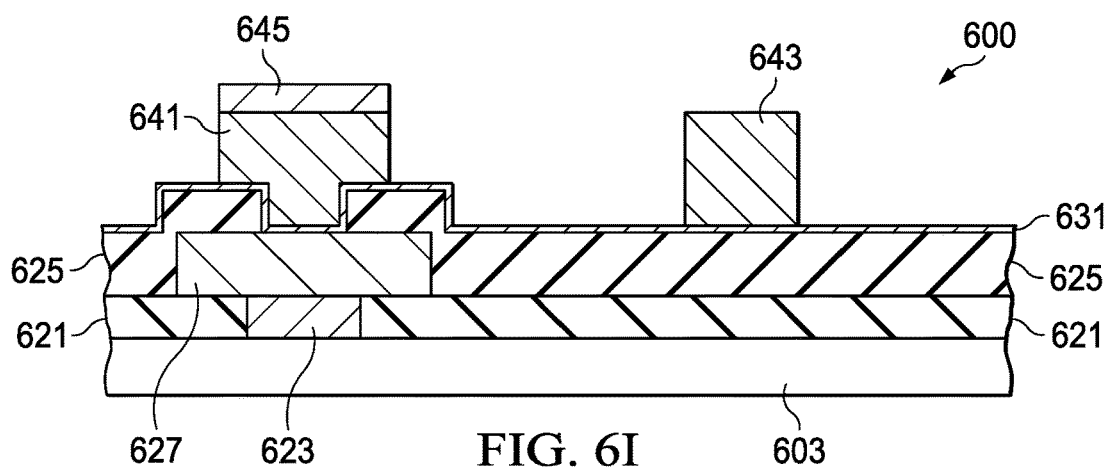
Figure 6J:
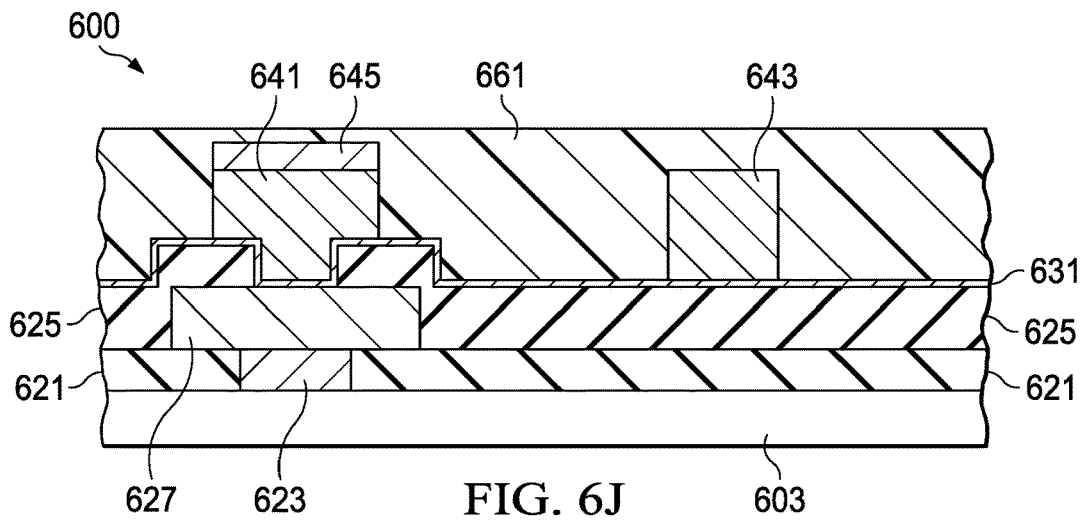
Figure 6K:
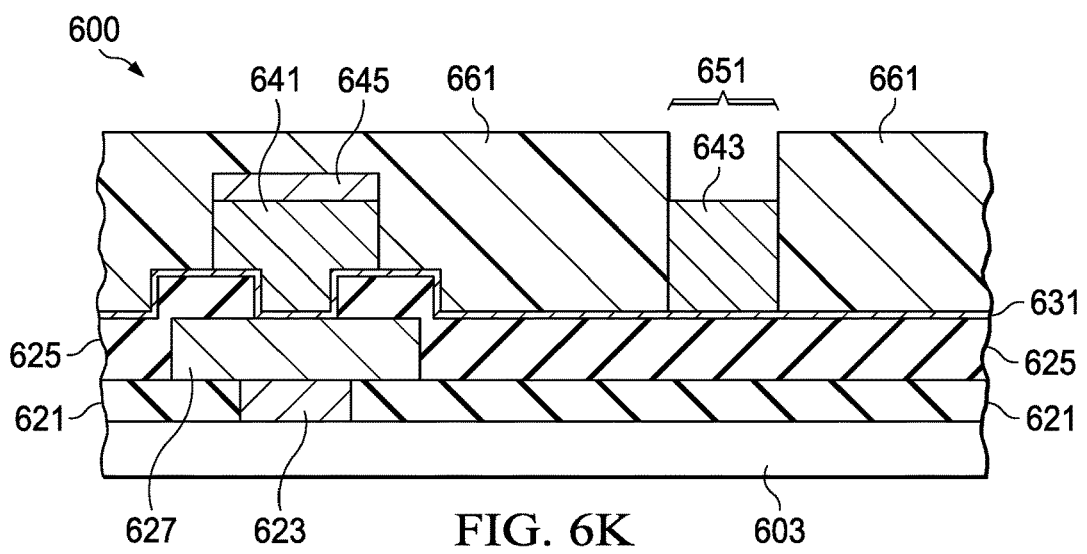
Figure 6L:
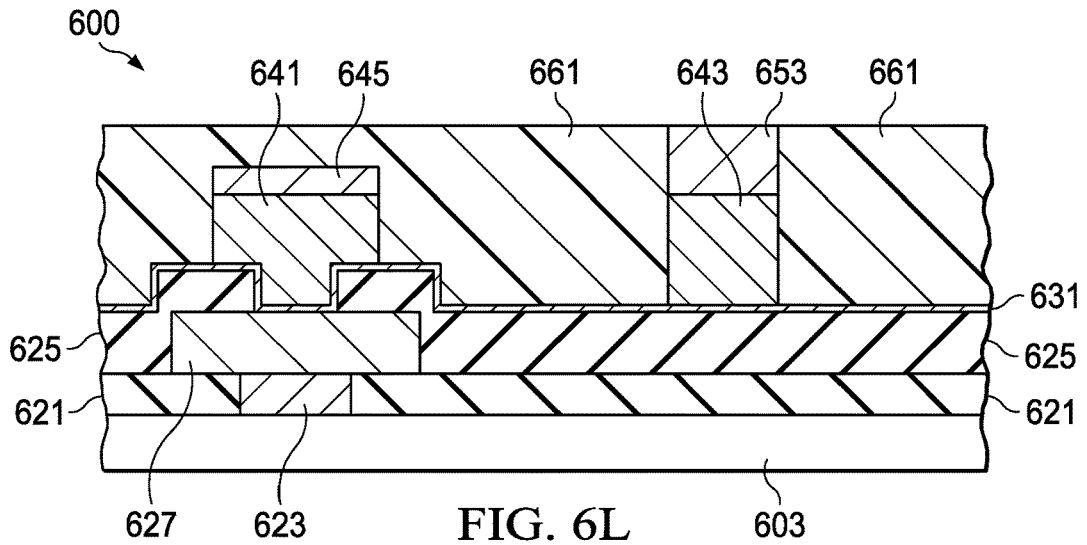

FIGS. 5A-5D illustrate in flow diagrams the major steps for forming the spacers and the pillar bumps of the arrangements (FIG. 5A) and detailed process steps for forming the pillars, the solder bumps, and the spacers (FIGS. 5B-5D). FIGS. 6A-6N illustrate in cross sections the results of various steps of the flow diagrams of FIGS. 5A-5D as is further described hereinbelow.

FIG. 5A illustrates in a flow diagram the major steps for forming the arrangements. In step 501, the pillars and a first portion of the spacers are formed on the active surface of a semiconductor substrate. In step 503, solder bumps are formed on the pillars. The solder bumps together with the pillars form the pillar bumps. In step 505, the spacers are extended to a predetermined distance (D1 in FIG. 4, for example) that is the completed height that the spacers extend from the surface of the semiconductor substrate. The results of these steps are shown in cross sections 600 in FIGS. 6A-6N, as is further described below.

In FIG. 5B, the details of step 501 (in FIG. 5A) are shown in another flow diagram. The results of these steps are also shown in cross sections 600 shown in FIGS. 6A-6E. In step 5011, a seed layer or under-bump material (UBM) is sputtered on the active surface of the semiconductor substrate. As shown in the cross section 600 of FIG. 6A, a semiconductor substrate 603 has a protective overcoat 621. The protective overcoat 621 can be a nitride, an oxide, an oxynitride or other dielectric layer. A bond pad 623 is shown at the surface of the semiconductor substrate 603 (in this example, bond pad 623 is aluminum (Al)). Other metals and alloys can be used as bond pads, for example, copper can be used. In the example of FIG. 6A, a redistribution layer (RDL) 627 is formed over the bond pad 623. In an example, a copper over aluminum (COA) RDL is used by forming a copper layer over an aluminum bond pad. The RDL layer 627 is formed in a passivation layer 625. In an example the passivation layer 625 may be polyimide (PI). As shown in FIG. 6A, a portion of the layer 627 is exposed by an opening in the passivation layer 625. A seed layer 631 is formed on the surface of the semiconductor substrate and covers the RDL layer 627 and the passivation layer 625.

Returning to FIG. 5B, the method continues at step 5013, coating the active surface of the semiconductor substrate 603 with a first photoresist 633. The photoresist 633 may be a positive or negative photoresist. The photoresist 633 lies over the seed layer 631.

Returning to FIG. 5B, the method continues to step 5015, where the first photoresist is patterned to define openings 636, 637 for both the pillars and the spacers. The photoresist is patterned and exposed. In FIG. 5B at step 5017 the photoresist is developed. The result of this step is shown in the cross section of FIG. 6C, where the first photoresist 633 has openings formed exposing the seed layer 631 in a location 636 over the layer 627 for forming a pillar, and at a second location 637 over the layer 625 and seed layer 631 where a spacer will be formed.

Returning to FIG. 5B, at step 5019, a plating operation is performed to form the pillars and a portion of the spacers of the arrangement. The result of the plating operation is shown in the cross section of FIG. 6D. In the examples described herein, at this stage the pillars 641 and the spacers 643 are formed of copper, as is the seed layer 631. The plating can be an electroplating process. In an alternative, an electroless plating operation can be performed. The plating operation fills the openings in the first photoresist 633 with the material to form the pillar 641, and the first portion of the spacer 643.

In FIG. 5B, the method continues to step 5021 where the first layer of photoresist (633 in FIG. 6D) is removed. The result of the step is shown in FIG. 6E. In FIG. 6E, the seed layer 631 is now exposed as the photoresist 633 (in FIG. 6D) was removed. In an example process photoresist stripping process is used. The result is shown in FIG. 6E where the pillar 641 and the spacer 643 are shown after the photoresist is removed.

Returning to FIG. 5A, the next major step, 503, forming the solder material at the ends of the pillars to form pillar bumps, is detailed in the flow diagram of FIG. 5C, and results of the steps are shown in the cross sections illustrated in FIGS. 6F-6I. In FIG. 5C, the method continues from the last step in FIG. 5B, 5021, to step 5031. At step 5031, a second photoresist is formed coating the active surface of the semiconductor wafer. The result of this step is shown in the cross section of FIG. 6F. The second photoresist layer 635 is shown coating the pillar 641 and the spacer 643.

The method of FIG. 5C continues at step 5033, where the second photoresist (635 in FIG. 6F) is patterned to define openings corresponding to the pillars, while protecting the spacers. At step 5035, the second photoresist is developed to expose the ends of the pillars. The results of these steps are shown in the cross section in FIG. 6G. The end of pillar 641 is exposed for further processing, while the second photoresist 635 protects the spacer 643.

The method of FIG. 5C continues at step 5037 where solder material is formed on the pillars to form pillar bumps. The results of this step are shown in the cross section of FIG. 6H where the solder layer 645 is shown formed over the end of the pillar 641. Solder is plated over the end of the pillar 641. In an example, a lead free solder of a tin-silver (SnAg) composition is plated. Other lead free solders such as tin silver copper (SnAgCu or "SAC") can be used. In an alternative, a lead containing solder such as PbSn can be used. The solder layer 645 is formed over the pillars 641, but is not formed over the spacers 643.

The method of FIG. 5C continues at step 5039, where the second photoresist layer is removed. The cross section in FIG. 6I shows the result of this step, with the pillar bump 610 formed including the pillar 641 and the solder layer 645.

Returning to FIG. 5A, the step 505 of forming the additional spacer material is performed. The process for step 505 is detailed in the flow chart in FIG. 5D. Beginning at step 5051, the semiconductor wafer is coated with a third photoresist layer. The result of step 5051 is shown in the cross section of FIG. 6J where the third photoresist layer 661 is shown formed over the pillar 641 and the spacer 643.

The method of FIG. 5D continues at steps 5053 and 5055 where the third photoresist layer 661 is patterned using a photolithographic step and a photomask, and the patterned photoresist is developed top form openings that expose the ends of the spacers. The results of these steps are shown in cross section at FIG. 6K where an opening 651 is shown over the spacer 643, while the third photoresist layer remains covering the pillar bump formed by pillar 641 and the solder layer 645.

The method of FIG. 5D continues at step 5057. At step 5057 the spacers are extended by additional electroplating or electroless plating of spacer material. In an example the spacer material is copper and additional copper is plated to extend the spacer to the desired height extending away from the surface of the semiconductor wafer. In an example, the spacer height determines a predetermined distance. After the methods of FIG. 5A-D are complete and an integrated circuit die including the pillar bumps and the spacers is flip chip mounted to a package substrate as described hereinabove, the length of any of at least two pillars added to the thickness of the solder joint formed between the ends of a selected pillar and a surface of the package substrate is within 10% of the predetermined distance. In an alternative the additional spacer material can be another material that is plated on the spacers, such as nickel, palladium, or other materials conducive to electroplating or electroless plating. The result of this step is shown in FIG. 6L where the spacer 643 has an additional portion 653 plated onto the exposed end (shown in FIG. 6K).

Figure 6M:
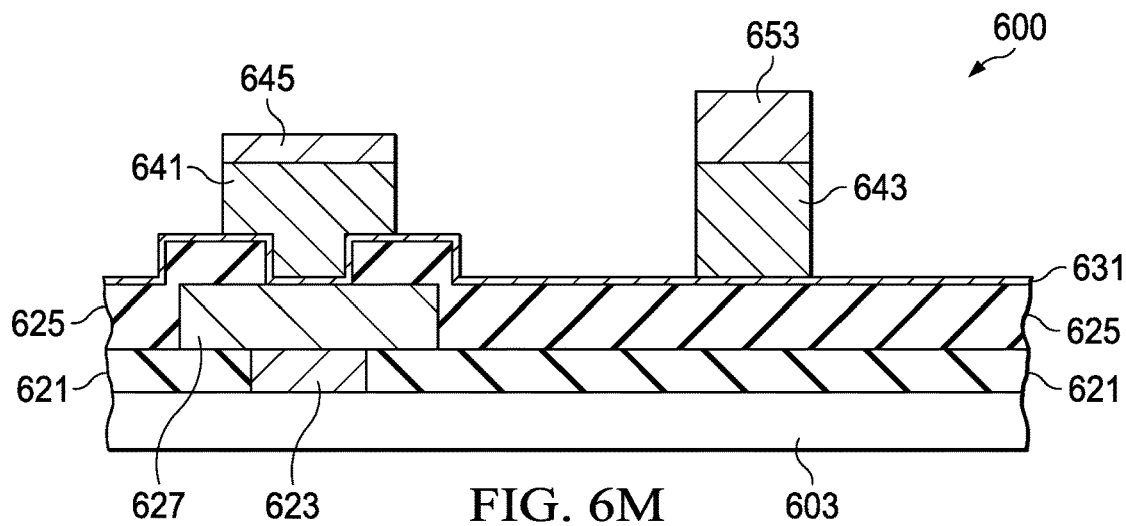
Figure 6N:
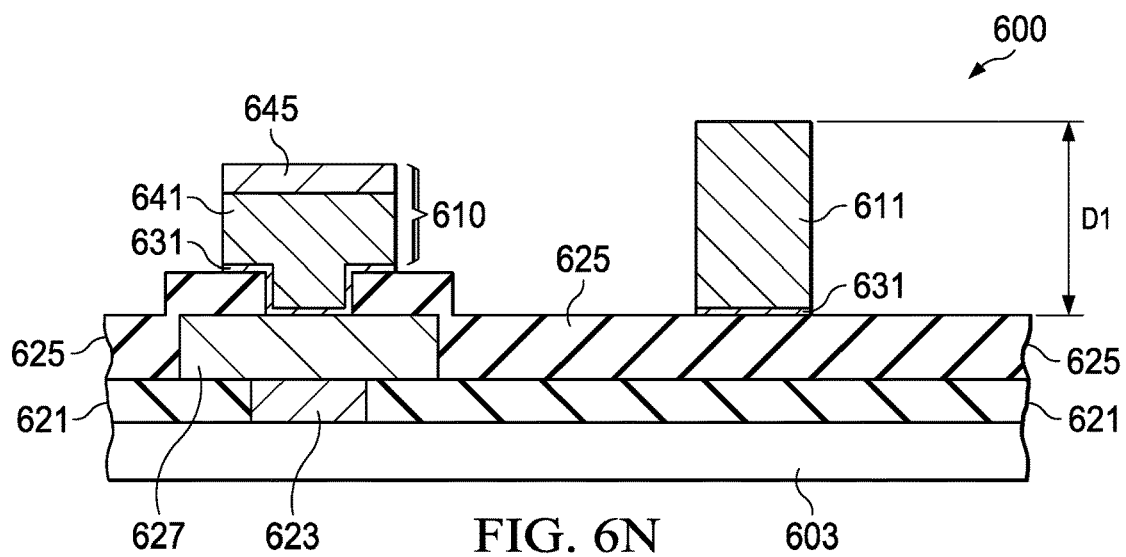

The method of FIG. 5D continues at step 5059, where the third layer of photoresist 661 (in FIG. 6L) is removed as shown in FIG. 6M. The completed pillar bumps (610) and the completed spacer (611) formed of portions 643, 653 are exposed. The spacer 611 extends from the surface of the semiconductor wafer to the predetermined distance D1 (see FIG. 6N). By adjusting the process conditions during the spacer forming process, the predetermined distance D1 can be controlled, which provides control over the spacing between the semiconductor surface and a package substrate when the integrated circuit dies are later mounted to the package substrate in a flip chip arrangement (as shown in FIG. 4 and described hereinabove.)

The method is completed at step 5061 in FIG. 5D, where the UBM material is removed. The result of this step is shown in the cross section of FIG. 6N, where the seed layer 631 (in FIG. 6M) is shown removed. In an example process an ashing (etching) step is performed to remove the UBM. As shown in FIG. 6N, the completed pillar bumps 610 including pillar 641 and solder layer 645, and the completed spacer 611, are formed at different heights. The distance D1 is the predetermined distance for spacer 611. Because the spacer heights are controlled and can be formed at the predetermined distance, the solder bond line thickness that is achieved during subsequent flip chip assembly and the thermal solder reflow process can be controlled using the distance D1. The spacers form a mechanical support and a spacing control for the assembled arrangements.

Figure 7A:
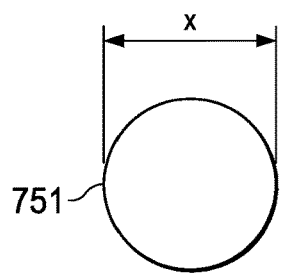
FIGS. 7A-7B illustrate in plan views example bump feature shapes for pillar bumps for use with arrangements.
Figure 7B:
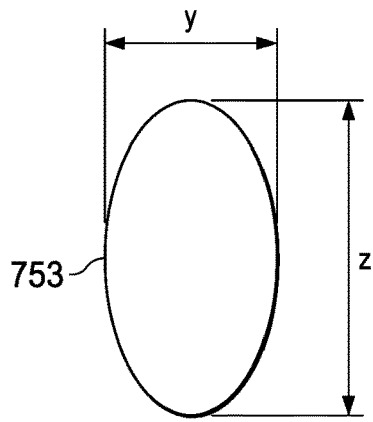

FIGS. 7A and 7B illustrate in two plan views bump feature sizes for two different sized pillar bumps. In FIG. 7A a round pillar bump feature 751 is shown with a diameter of "X." In an example, the diameter is in the range of 50 to 150 microns. In FIG. 7B, an oval bump feature 753 is shown with a width "Y" of about 100 microns and a length "Z" of about 300 microns. In additional examples, the oval bump feature can have a width between 50 and 200 microns; and a length between 100 and 400 microns. Other shapes can be used, and other sizes can be used. In determining the pillar bump features, the choice of size and shape can be determined by the current that will be carried by the pillar bump for a particular signal from (or to) the integrated circuit. The spacers can also be of different size and shape from the shapes of the pillars, but in a particular arrangement the spacers should all have the same size and shape for a given integrated circuit die. In an example, a first spacer has a first cross sectional shape and area, and the remaining spacers have the first cross sectional shape and area. By using a same size and shape for all of the spacers, coplanarity of the completed spacers can be maintained. In this manner the spacing distance obtained, and the solder bond line thickness formed after solder reflow, is uniform across the integrated circuit die when later mounted on the package substrate.

Figure 8A:
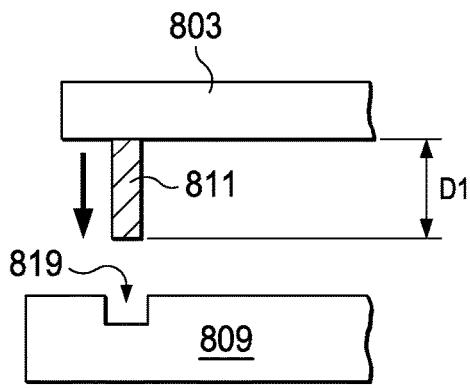
FIGS. 8A-8B each illustrate arrangements for mounting an integrated circuit die with spacers on package substrates with lock structures.
Figure 8B:
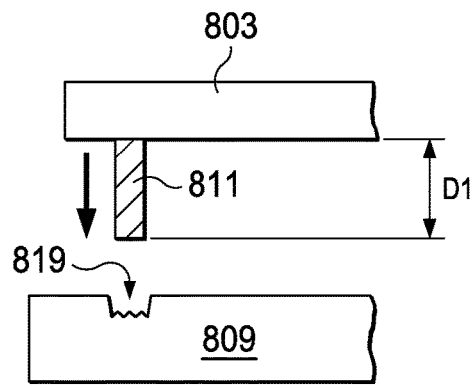

FIGS. 8A and 8B illustrate in two cross sectional views two additional arrangements where a locking feature is provided in a package substrate. In FIG. 8A, an integrated circuit die 803 (a portion of 803 is shown in FIG. 8A) has a spacer 811, and also the integrated circuit die 803 has additional spacers and pillar bumps (not shown). The package substrate 809 has a lock structure 819 which is an opening or slot configured to receive the spacer end as the integrated circuit die 803 is flip chip mounted to the package substrate 809. The lock structure 819 provides an alignment guide for the assembly so that the integrated circuit die 803 is properly positioned when the spacer 811 is aligned with and inserted into the lock structure 819. In FIG. 8A, the lock can be formed by etching of the package substrate 809. In an example, the package substrate 809 is a copper lead frame.

FIG. 8B illustrates in a cross section an alternative arrangement where a lock structure 819 is formed in a similar manner to that of FIG. 8A, however a coining or punching operation is used to form the lock structure 819 in package substrate 809. Again the integrated circuit die 803 has a spacer 811 in a position such that when the spacer end is inserted into the lock structure 819, the integrated circuit die including pillar bumps (not shown in FIGS. 8A-8B) that are to be coupled to lands (also not shown) on the package substrate 809 is in a correct alignment for assembling the flip chip integrated circuit die to the package substrate. Use of package substrates including the lock features reduces or eliminates the need for pre-plating lands on a substrate to provide the alignment between the pillar bump and the substrate. In an arrangement where the package substrate includes the lock features, the alignment during solder reflow is maintained by the use of the locks and the spacers with portions positioned in the locks. For example, pre-plating of lands on the leads on a lead frame used as a package substrate may not be needed in an application using a copper lead frame and the lock features with the spacers. Reliable solder joints in the correct locations can be formed without pre-plating lands when the lock features control alignment between the flip chip integrated circuit and the package substrate. In an example, a thin pre-plating coating may be provided over the entire lead frame prior to assembly, without forming specific lands for particular pillar bumps to bond to.

Figure 9:
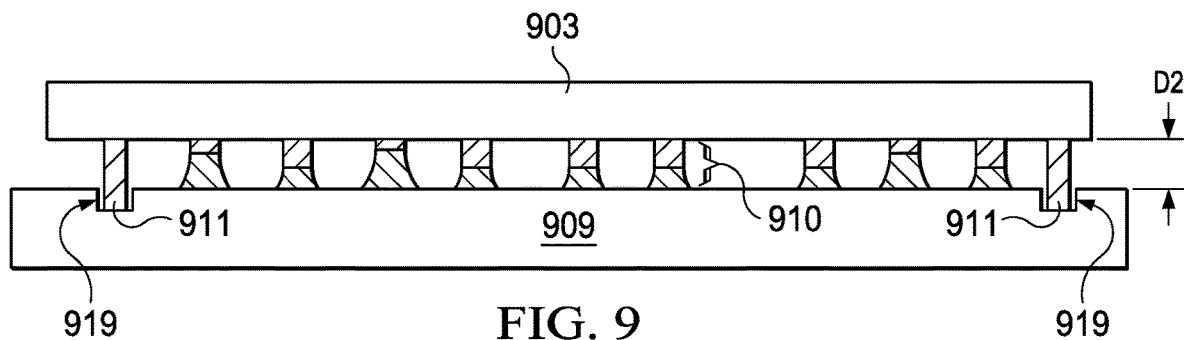
FIG. 9 is a cross section of an arrangement illustrating an integrated circuit die mounted on a surface of a lead frame with spacers in lock structures.

FIG. 9 illustrates in a cross section an arrangement where an integrated circuit die 903 is assembled to a package substrate 909. In FIG. 9, similar reference numerals are used for similar elements as shown in FIG. 4, for clarity. For example, package substrate 909 corresponds to package substrate 409 in FIG. 4. In FIG. 9, pillar bumps 910 are shown after reflow. In FIG. 9, after the spacers 911 are placed extending into the lock structures 919, the spacing between the surface of the integrated circuit die 903 and the package substrate 909, is a predetermined distance D2. As seen by comparing this figure to FIGS. 8A-8B, the distance D2 is less than the length of the spacers, D1, because in this arrangement the spacers extend into the lock structure 919 in package substrate 909. In an arrangement, the height of the spacer, minus a depth of the lock structure, forms the predetermined spacing D2 between an active surface of the integrated circuit and a surface of the package substrate. The lock structure 919 can be etched into the package substrate 909 as in FIG. 8A or can be coined into the package substrate as in FIG. 8B. The spacing distance D2 can be adjusted by controlling the length of the spacers 911.

Figure 10:
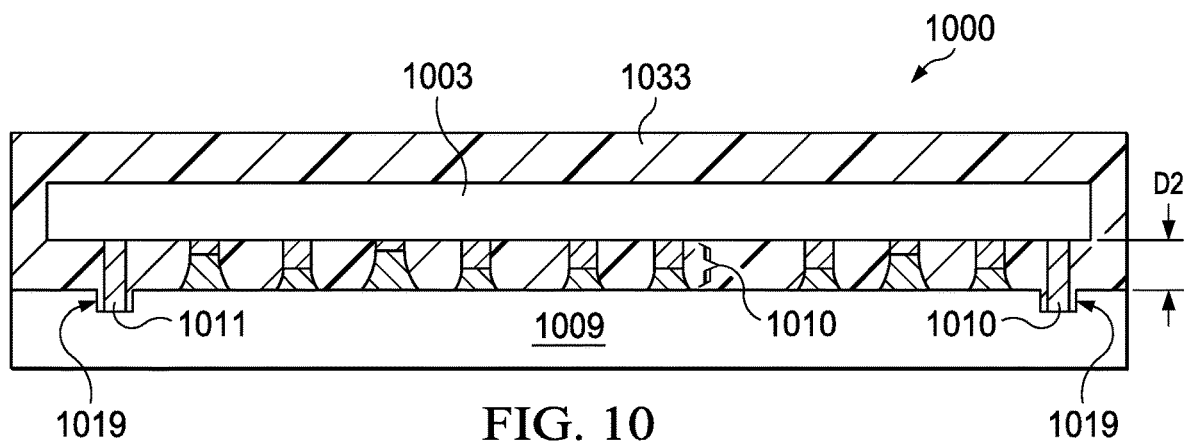
FIG. 10 is a cross section illustrating a packaged integrated circuit arrangement.

FIG. 10 illustrates in a cross sectional view a packaged integrated circuit 1000 including the arrangements. For clarity, the reference labels of FIG. 10 correspond to similar elements in FIG. 9, for example, integrated circuit die 1003 corresponds to die 903 in FIG. 9. In FIG. 10, an integrated circuit die 1003 with pillar bumps 1010 and spacers 1011 is flip chip mounted to a package substrate 1009, for example a copper lead frame. Locks 1019 are shown with the spacers 1011 inserted into them. A mold compound 1033 forms a completed package and surrounds the integrated circuit die 1003, the pillar bumps 1010, and the spacers 1011, and a portion of the package substrate 1009. Thus the combination of the mold compound, the integrated circuit die, and the package substrate forms a packaged integrated circuit. Other portions of package substrate 1109, which in this example is a copper lead frame, form external terminals or thermal pads for the completed package and these portions (not shown) are not covered in the mold compound 1033. The mold compound 1033 can be an epoxy, a resin, or a thermoset epoxy resin that is formed in a block molding press. The molding process can be referred to as an "encapsulation" process, even though portions of the package substrate 1009 will be free from molding compound after "encapsulation" is complete. In an example process, after molding a lead frame strip including several lead frames receiving several individual integrated circuit devices, the individual packaged integrated circuits are separated from one another by a sawing or laser operation that cuts through the lead frame material and the mold compound to form packages. Portions of the lead frame are not covered by the mold compound but remain exposed, these exposed lead frame portions form external terminals for the packaged integrated circuit. In another example the completed packages can be quad flat no-lead (QFN) packages for surface mounting to a system board.

Figure 11:
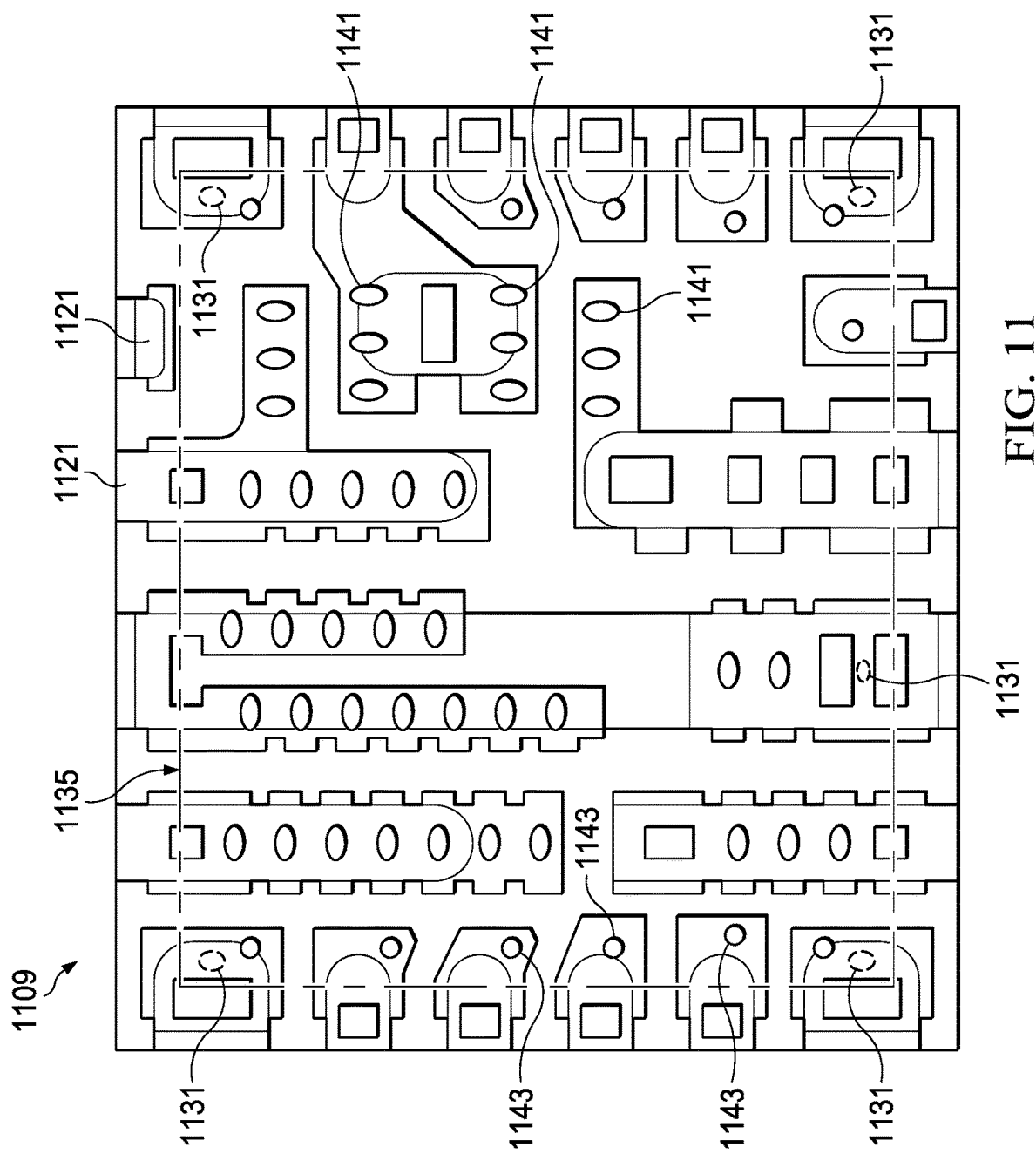
FIG. 11 is a plan view of a lead frame for use with an arrangement with spacer locations indicated.

FIG. 11 illustrates in a plan view a package substrate 1109 with leads 1121 patterned and lands for receiving the pillar bumps of an integrated circuit die (see 903 in FIG. 9, for example). Note that the example cross sections of FIGS. 9 and 10 do not correspond to the plan view of the additional example package substrate in FIG. 11. In FIG. 11, oval lands 1141 are arranged on package substrate 1109 to receive oval shaped pillar bumps, while circular lands 1143 are arranged to receive round shaped pillar bumps.

In FIG. 11 the package substrate 1109 has a die mount area indicated as 1135 and portions 1131 that identify potential locations for spacers on the integrated circuit die that is to be mounted to substrate 1109. Note that the spacers are not shown in FIG. 11, instead, the locations 1131 indicate where spacers can be used. The outline of die mount area portion 1135 in FIG. 11 indicates the position and size of the integrated circuit to be mounted on the substrate 1109. In one example, the spacers are placed at the exterior corners of the integrated circuit die. For example, a first spacer can be placed in a first corner of the integrated circuit die, and additional spacers can be placed at the remaining three corners so that there is a spacer in each of the four corners of the integrated circuit die to be mounted to substrate 1109. In additional alternative examples labeled 1131, interior positions that are free from pillar bumps can also have spacers at those locations to provide additional mechanical support and provide solder bond line thickness control during thermal reflow. Because the integrated circuit die and the lead frame pattern vary with different integrated circuit designs, the spacer locations will also vary depending on the available spaces and the size of the integrated circuit die. Misalignment, die warp and die tilt can be avoided or reduced by using additional spacers for larger integrated circuit dies.

Modifications are possible in the described arrangements, and other alternative arrangements are possible within the scope of the claims.

What is claimed is:

1. An apparatus, comprising:
   a semiconductor substrate having an active surface with bond pads thereon;
   at least two pillar bumps formed on at least two of the bond pads, the at least two pillar bumps extending away from the active surface and having ends spaced from the semiconductor substrate with solder material at the ends of the at least two pillar bumps;
   at least one spacer formed of a single metal, and formed on the active surface of the semiconductor substrate and extending away from the semiconductor substrate, the at least one spacer extending a predetermined distance from the active surface of the semiconductor substrate;
   a package substrate having a die mount area on a first surface for mounting the semiconductor substrate, the die mount area including portions receiving the ends of the at least two pillar bumps and receiving an end of the at least one spacer; and
   mold compound covering the semiconductor substrate, the at least two pillar bumps, the at least one spacer, and at least a portion of the package substrate.

2. The apparatus of claim 1, wherein the solder material at the ends of the at least two pillar bumps forms solder joints on the die mount area of the package substrate.

3. The apparatus of claim 2, wherein a thickness of the solder joints formed between the at least two pillar bumps and the die mount area of the package substrate is determined by the predetermined distance of the at least one spacer.

4. The apparatus of claim 1, wherein the predetermined distance of the at least one spacer determines a spacing between the first surface of the package substrate and the active surface of the semiconductor substrate.

5. The apparatus of claim 1, wherein the at least two pillar bumps are a material that is one selected from copper and its alloys.

6. The apparatus of claim 1, wherein the solder material is one selected from a group consisting essentially of: tin and silver; tin, silver and copper; and tin and lead.

7. The apparatus of claim 1 wherein the semiconductor substrate is an integrated circuit die that has four corners, the at least one spacer is at one of the four corners, and further comprising additional spacers on the active surface of the integrated circuit die placed at the remaining three corners.

8. The apparatus of claim 1, wherein the at least one spacer is a conductive material.

9. The apparatus of claim 8, wherein the conductive material is copper.

10. The apparatus of claim 1, wherein the at least one spacer and the at least two pillar bumps further comprise copper.

11. The apparatus of claim 1, wherein a height of the at least two pillar bumps are different.

12. The apparatus of claim 11, wherein the predetermined distance of the spacer is equal to the height of the at least two pillar bumps and a height of the solder material attached to each of the at least two pillar bumps.

13. An apparatus, comprising:
    a lead frame having a die mount area on a first surface and having lock structures extending from the first surface into the lead frame; and
    a semiconductor substrate having an active surface, further comprising:
    at least two pillars on bond pads on the active surface of the semiconductor substrate, the at least two pillars extending away from the active surface and having solder material disposed on ends of the at least two pillars to form at least two pillar bumps; and
    at least one spacer of a single metal extending from the active surface of the semiconductor substrate at a predetermined distance from the active surface of the semiconductor substrate and having a spacer end;
    wherein the semiconductor substrate, the at least two pillar bumps and the at least one spacer are flip chip mounted to the die mount area of the lead frame, the solder material forming solder joints between the first surface of the lead frame and the at least two pillar bumps, and the spacer end and a portion of the at least one spacer is positioned in a selected one of the lock structures extending into the lead frame.

14. The apparatus of claim 13, wherein the lock structures are etched into the first surface of the lead frame.

15. The apparatus of claim 13, wherein the lock structures are formed by coining the lead frame.

16. The apparatus of claim 13, wherein a length of the spacer minus a depth of the lock structures forms the predetermined distance.

17. The apparatus of claim 16, wherein the predetermined distance of the spacer is equal to the height of the at least two pillar bumps and a height of the solder material attached to each of the at least two pillar bumps.

18. The apparatus of claim 13, and further comprising mold compound covering the semiconductor substrate, the at least two pillar bumps, the at least one spacer, and portions of the lead frame.

19. The apparatus of claim 18, wherein the semiconductor substrate is an integrated circuit die, and the mold compound with the lead frame and the integrated circuit die forms a packaged integrated circuit.

20. The apparatus of claim 13, wherein a height of the at least two pillar bumps are different.

21. The apparatus of claim 13, wherein a surface of each of the lock structures is coated with nickel, gold, palladium or combinations thereof.

* * * * *